US010250245B2

United States Patent
Chiba (10) Patent No.: US 10,250,245 B2
(45) Date of Patent: Apr. 2, 2019

(54) INPUT DEVICE WHICH OUTPUTS A SIGNAL HAVING A LEVEL CORRESPONDING TO A STATE IN WHICH A VOLTAGE VALUE OF AN INPUT SIGNAL IS HIGHER OR LOWER THAN A THRESHOLD VALUE

(71) Applicant: THINE ELECTRONICS, INC., Tokyo (JP)

(72) Inventor: Yutaka Chiba, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 15/656,107

(22) Filed: Jul. 21, 2017

(65) Prior Publication Data

US 2018/0026616 A1    Jan. 25, 2018

(30) Foreign Application Priority Data

Jul. 22, 2016 (JP) ................................. 2016-144445

(51) Int. Cl.
*H03K 5/22* (2006.01)
*H03K 5/24* (2006.01)

(52) U.S. Cl.
CPC ............ *H03K 5/24* (2013.01); *H03K 5/2472* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,524,351 A * | 6/1985 | Kimura | ................. | G01N 27/66 250/384 |
| 5,942,921 A * | 8/1999 | Talaga, Jr. | ........... | H03K 5/2481 326/115 |
| 6,586,984 B1 * | 7/2003 | Radke | ..................... | H03K 5/08 327/309 |
| 7,233,174 B2 * | 6/2007 | Martins | ............... | H03K 5/2481 327/63 |
| 8,080,983 B2 | 12/2011 | Lourens et al. | | |

FOREIGN PATENT DOCUMENTS

JP    2013-90136 A    5/2013

* cited by examiner

*Primary Examiner* — An T Luu
(74) *Attorney, Agent, or Firm* — Sughrue Mion, PLLC (57) ABSTRACT

The embodiment relates to an input device comprises first and second MOS transistors, first to fourth resistors, and a comparator circuit. The first MOS transistor has a drain connected to a first terminal having a first voltage, a gate connected to a signal input terminal, and a source connected to a second terminal having a second voltage via the first and third resistors. The second MOS transistor has a drain and a gate connected to the first terminal, and a source connected to the second terminal via the second and fourth resistors. The comparator circuit outputs a signal having a level corresponding to a state in which a voltage of a node between the first and third resistors is higher or lower than a voltage of a node between the second and fourth resistors.

10 Claims, 5 Drawing Sheets

INPUT DEVICE WHICH OUTPUTS A SIGNAL HAVING A LEVEL CORRESPONDING TO A STATE IN WHICH A VOLTAGE VALUE OF AN INPUT SIGNAL IS HIGHER OR LOWER THAN A THRESHOLD VALUE

TECHNICAL FIELD

The present invention relates to an input device which outputs a signal having a level corresponding to a state in which a voltage value of an input signal is higher or lower than a threshold value.

BACKGROUND

An input device for inputting a signal shapes a waveform of an input signal, and amplifies the input signal or corrects distortion of the input signal as necessary. When shaping a waveform, by outputting a signal having a level corresponding to a state in which a voltage value of an input signal is higher or lower than a threshold value, the input device can generate a digital signal based on the input signal.

SUMMARY

The inventors have studied a conventional signal input device and found the following problem. That is, the conventional input device cannot easily accurately determine whether a voltage value of an input signal is higher or lower than a threshold value when the threshold value is higher than a power supply voltage (for example, the power supply voltage is 2 to 3.6 V, and the threshold value is 3.8 V).

In the input devices disclosed in U.S. Pat. No. 8,080,983 (Patent Document 1) and Japanese Patent Application Laid-Open No. 2013-90136 (Patent Document 2), the resistance dividing circuit generates a low voltage value proportional to a voltage value of an input signal, and the comparator circuit outputs a signal having a level corresponding to a state in which the generated voltage value is higher or lower than a threshold value. However, such an input device cannot accurately determine whether the voltage value of the input signal is higher or lower than the threshold value.

The present invention has been made to solve the problem as described above, and is to provide an input device capable of accurately and easily determining a state in which a voltage value of an input signal is higher or lower than a threshold value when the threshold value is higher than a power supply voltage.

An input device according to the present embodiment comprises a first reference terminal, a second reference terminal, a signal input terminal for receiving an input signal, and a signal output terminal. The input device is driven by a first reference voltage set to the first reference terminal (first reference voltage input terminal) and a second reference voltage set to the second reference terminal (second reference voltage input terminal), and outputs a signal having a level corresponding to a state in which a voltage value of an input signal is higher than a threshold value or the voltage value of the input signal is lower than the threshold value. Specifically, the input device comprises first and second MOS transistors, first to fourth resistors, and a comparator circuit (comparator). The first MOS transistor has a drain electrically connected to the first reference terminal, a gate electrically connected to the signal input terminal, and a source. The second MOS transistor has a drain and a gate electrically connected to the first reference terminal, and a source. The first resistor has one end electrically connected to the source of the first MOS transistor, and the other end electrically connected to a first node. The second resistor has one end electrically connected to the source of the second MOS transistor, and the other end electrically connected to a second node. The third resistor has one end electrically connected to the first node, and the other end electrically connected to the second reference terminal. The fourth resistor has one end electrically connected to the second node, and the other end electrically connected to the second reference terminal. The comparator circuit has a first input terminal, a second input terminal, and an output terminal which is the signal output terminal of the input device. The first input terminal is electrically connected to the first node and set at the same voltage as the first node. The second input terminal is electrically connected to the second node and set at the same voltage as the second node. The output terminal outputs a signal having a level corresponding to a state in which a voltage of the second input terminal is higher than a voltage of the first input terminal or a level corresponding to a state in which the voltage of the second input terminal is lower than the voltage of the first input terminal.

DETAILED DESCRIPTION

[Description of Embodiments of the Present Invention]

First, embodiments of the present invention are individually described in order.

(1) An input device according to the present embodiment comprises a first reference terminal (first reference voltage input terminal), a second reference terminal (second reference voltage input terminal), a signal input terminal for receiving an input signal, and a signal output terminal. As an aspect, the input device is driven by a first reference voltage set to the first reference terminal and a second reference voltage set to the second reference terminal, and outputs a signal having a level corresponding to a state in which a voltage value of an input signal is higher than a threshold value or a level corresponding to a state in which the voltage value of the input signal is lower than the threshold value. Specifically, the input device comprises first and second MOS transistors, first to fourth resistors, and a comparator circuit (comparator). The first MOS transistor has a drain electrically connected to the first reference terminal, a gate electrically connected to the signal input terminal, and a source. The second MOS transistor has a drain and a gate electrically connected to the first reference terminal, and a source. The first resistor has one end electrically connected to the source of the first MOS transistor, and the other end electrically connected to a first node. The second resistor has one end electrically connected to the source of the second MOS transistor, and the other end electrically connected to a second node. The third resistor has one end electrically connected to the first node, and the other end electrically connected to the second reference terminal. The fourth resistor has one end electrically connected to the second node, and the other end electrically connected to the second reference terminal. The comparator circuit has a first input terminal, a second input terminal, and an output terminal which is the signal output terminal of the input device. The first input terminal is electrically connected to the first node and set at the same voltage as the first node. The second input terminal is electrically connected to the second node and set at the same voltage as the second node. The output terminal outputs a signal having a level corresponding to a state in which a voltage of the second input terminal is higher than a voltage of the first input terminal or a level corresponding to a state in which the voltage of the second input terminal is lower than the voltage of the first input terminal.

(2) As an aspect of the present embodiment, it is preferable that a resistance value of the third resistor is equal to a resistance value of the fourth resistor.

(3) As an aspect of the present embodiment, it is preferable that a resistance value of the third resistor is more than ten times larger than a resistance value of the first resistor, and a resistance value of the fourth resistor is more than 10 times larger than a resistance value of the second resistor. In this case, the resistance values of the third resistor and the fourth resistor may be equal to each other.

(4) As an aspect of the present embodiment, the input device may include first and second MOS transistors, first and second resistors, first and second current sources, and a comparator circuit. The first MOS transistor has a drain electrically connected to the first reference terminal, a gate electrically connected to the signal input terminal, and a source. The second MOS transistor has a drain and a gate electrically connected to the first reference terminal, and a source. The first resistor has one end electrically connected to the source of the first MOS transistor, and the other end electrically connected to a first node. The second resistor has one end electrically connected to the source of the second MOS transistor, and the other end electrically connected to a second node. The first current source has one end electrically connected to the first node, and the other end electrically connected to the second reference terminal. The second current source has one end electrically connected to the second node, and the other end electrically connected to the second reference terminal. The comparator circuit has a first input terminal, a second input terminal, and an output terminal which is the signal output terminal of the input device. The first input terminal is electrically connected to the first node and set at the same voltage as the first node. The second input terminal is electrically connected to the second node and set at the same voltage as the second node. The output terminal outputs a signal having a level corresponding to a state in which a voltage of the second input terminal is higher than a voltage of the first input terminal or a level corresponding to a state in which the voltage of the second input terminal is lower than the voltage of the first input terminal.

(5) As an aspect the present embodiment, it is preferable that a current flowing through the first current source is equal to a current flowing through the second current source.

(6) As an aspect of the present embodiment, the input device may further include a fifth MOS transistor having one end electrically connected to the first reference terminal, and the other end electrically connected to the drain of the second MOS transistor Furthermore, as an aspect of the present embodiment, the sum of a resistance value of the second resistor and a resistance value of the fifth resistor may be equal to a resistance value of the first resistor.

Each aspect listed in [Description of embodiments of the present invention] is applicable to each of the other aspects or all combinations of the other aspects.

[Details of Embodiments of the Present Invention]

Hereinafter, a specific configuration of an input device according to the present embodiment are described in detail with reference to the attached drawings. Note that, the present invention is not limited to examples to be described, is represented by claims, and includes all modifications within the meaning and scope equivalent to claims. In the description of the drawings, identical elements are denoted by the same reference signs, and overlapped descriptions are omitted.

In the following description, configurations of comparative examples are described, and then configurations of embodiments of the present invention will be described.

(First Comparative Example)

Figure 1:
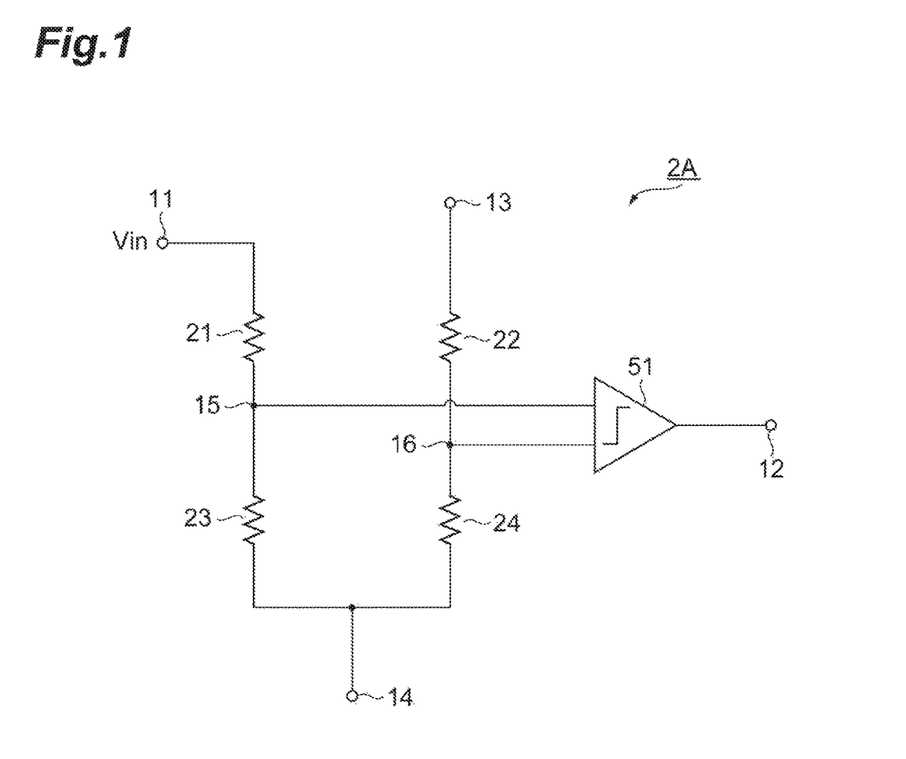
FIG. 1 is a diagram showing a configuration of an input device 2A according to a first comparative example.

FIG. 1 is a diagram showing a configuration of an input device 2A according to a first comparative example. The input device 2A comprises resistors 21 to 24 and a comparator circuit 51. The input device 2A is driven by a first reference voltage (for example, a power supply voltage VDD) set to a first reference terminal (first reference voltage input terminal) 13 and a second reference voltage (for example, a ground voltage) set to a second reference terminal (second reference voltage input terminal) 14, and outputs, from a signal output terminal 12, a signal having a level corresponding to a state in which a voltage value Vin of an input signal inputted to a signal input terminal 11 is higher or lower than a threshold value $V_{TH\_IN}$.

The resistor 21 has one end connected to the signal input terminal 11, and the other end connected to a first node 15. The resistor 22 has one end connected to the first reference terminal 13 and the other end connected to a second node 16. The resistor 23 has one end connected to the first node 15, and the other end connected to the second reference terminal 14. The resistor 24 has one end connected to the second node 16, and the other end connected to the second reference terminal 14.

The comparator circuit 51 has a first input terminal connected to the first node 15, a second input terminal connected to the second node 16, and the signal output terminal 12. The comparator circuit 51 outputs, from the signal output terminal 12, a signal having a level corresponding to a state in which the voltage of the first node 15 is higher or lower than the voltage of the second node 16.

It is assumed that the resistance value of the resistor 21 is $R_1$, the resistance value of the resistor 22 is $R_2$, the resistance value of the resistor 23 is $R_3$, and the resistance value of the resistor 24 is $R_4$. At this time, the voltage of the first node 15 is expressed by $Vin \cdot R_3/(R_1+R_3)$, and the voltage of the second node 16 is expressed by $VDD \cdot R_4/(R_2+R_4)$. Therefore, the threshold value $V_{TH\_IN}$ is expressed by the following formula (1):

$$V_{TH\_IN} = \frac{R_4/(R_2+R_4)}{R_3/(R_1+R_3)} VDD \tag{1}$$

The input device 2A according to the first comparative example can determine whether the voltage value Vin of the input signal is higher or lower than the threshold value $V_{TH\_IN}$ by appropriately setting the resistance values $R_1$ to $R_4$ when the threshold value $V_{TH\_IN}$ is higher than the power supply voltage VDD defined by the voltage difference between the first reference terminal 13 and the second reference terminal 14.

In the input device 2A according to the first comparative example, since the variation in the resistance ratio is small, the variation in the threshold $V_{TH\_IN}$ is also small. However, the input impedance of the input device 2A is $R_1+R_3$, and which is not high impedance. Thus, the characteristics of the device which transmits a signal to the input device 2A are affected, and the voltage value Vin of the input signal varies. Therefore, it is difficult for the input device 2A according to the first comparative example to accurately determine whether the voltage value of the input signal is higher or lower than the threshold value.

(Second Comparative Example)

Figure 2:
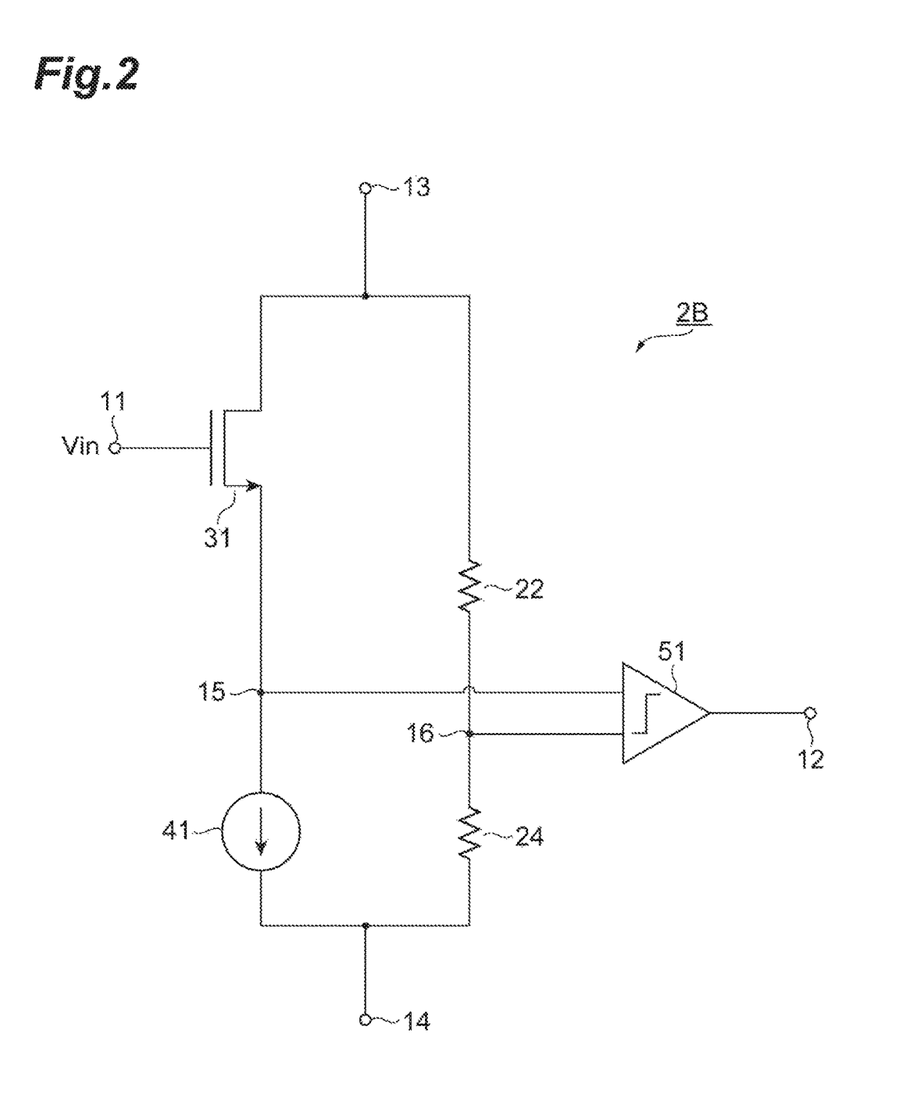
FIG. 2 is a diagram showing a configuration of an input device 2B according to a second comparative example.

FIG. 2 is a diagram showing a configuration of an input device 2B according to a second comparative example. The input device 2B comprises a MOS transistor 31, a current source 41, resistors 22 and 24, and a comparator circuit 51. The input device 2B according to the second comparative example shown in FIG. 2 is different from the configuration of the input device 2A according to the first comparative example shown in FIG. 1 in that the MOS transistors 31 and the current source 41 are provided instead of the resistors 21 and 23. However, the other configuration of the input device 2B according to the second comparative example is the same as that in the first comparative example.

The MOS transistor 31 has a drain connected to a first reference terminal 13, a source connected to a first node 15, and a gate connected to a signal input terminal. The MOS transistor 31 is an N-channel MOS transistor, and a power supply voltage VDD is applied to the drain connected to the first reference terminal 13 (the drain is set at the power supply voltage VDD). An input signal Vin is inputted to the gate connected to the signal input terminal 11. The current source 41 has one end connected to the first node 15 and the other end connected to a second reference terminal 14, and flows a certain amount of current from the first node 15 to the second reference terminal 14.

When it is assumed that the voltage difference between the gate and the source of the MOS transistor 31 is $V_{GS}$, the voltage of the first node 15 is expressed by Vin-$V_{GS}$. When it is assumed that the resistance value of the resistor 22 is $R_2$ and the resistance value of the resistor 24 is $R_4$, the voltage of a second node 16 is expressed by VDD·$R_4$/($R_2$+$R_4$). Therefore, a threshold value $V_{TH\_IN}$ is expressed by the following formula (2):

$$V_{TH\_IN} = V_{GS} + \frac{R_4}{R_2 + R_4} VDD \qquad (2)$$

Note that, $V_{GS}$ is expressed by the following formula (3): In formula (3), L is the channel length of the MOS transistor, $\mu_n$ is the mobility of electrons in the MOS transistor, $C_{ox}$ is the capacitance value of the oxide film of the MOS transistor, W is the channel width of the MOS transistor, $I_D$ is the drain current, $V_{TH\_NMOS}$ is the threshold voltage of the MOS transistor, and $V_{GS}$ is generally 0.4 to 0.6 V.

$$V_{GS} = \sqrt{\frac{L}{\mu_n C_{ox} W} I_D} + V_{TH\_NMOS} \qquad (3)$$

The input device 2B according to the second comparative example can determine whether the voltage value Vin of the input signal is higher or lower than the threshold value $V_{TH\_IN}$ by appropriately setting the voltage difference $V_{GS}$ between the gate and the source of the MOS transistor 31 and the resistance values $R_2$ and $R_4$ when the threshold value $V_{TH\_IN}$ is higher than the power supply voltage VDD.

In the input device 2B according to the second comparative example, since an input signal is inputted to the gate of the MOS transistor 31, the input impedance is high, which is preferable in this respect. However, since the variation in the threshold value $V_{TH\_NMOS}$ of the MOS transistor is large, the variation in the threshold value $V_{TH\_IN}$ is also large. Therefore, it is difficult for the input device 2B according to the second comparative example to accurately determine whether the voltage value of the input signal is higher or lower than the threshold value.

(First Embodiment)

Figure 3:
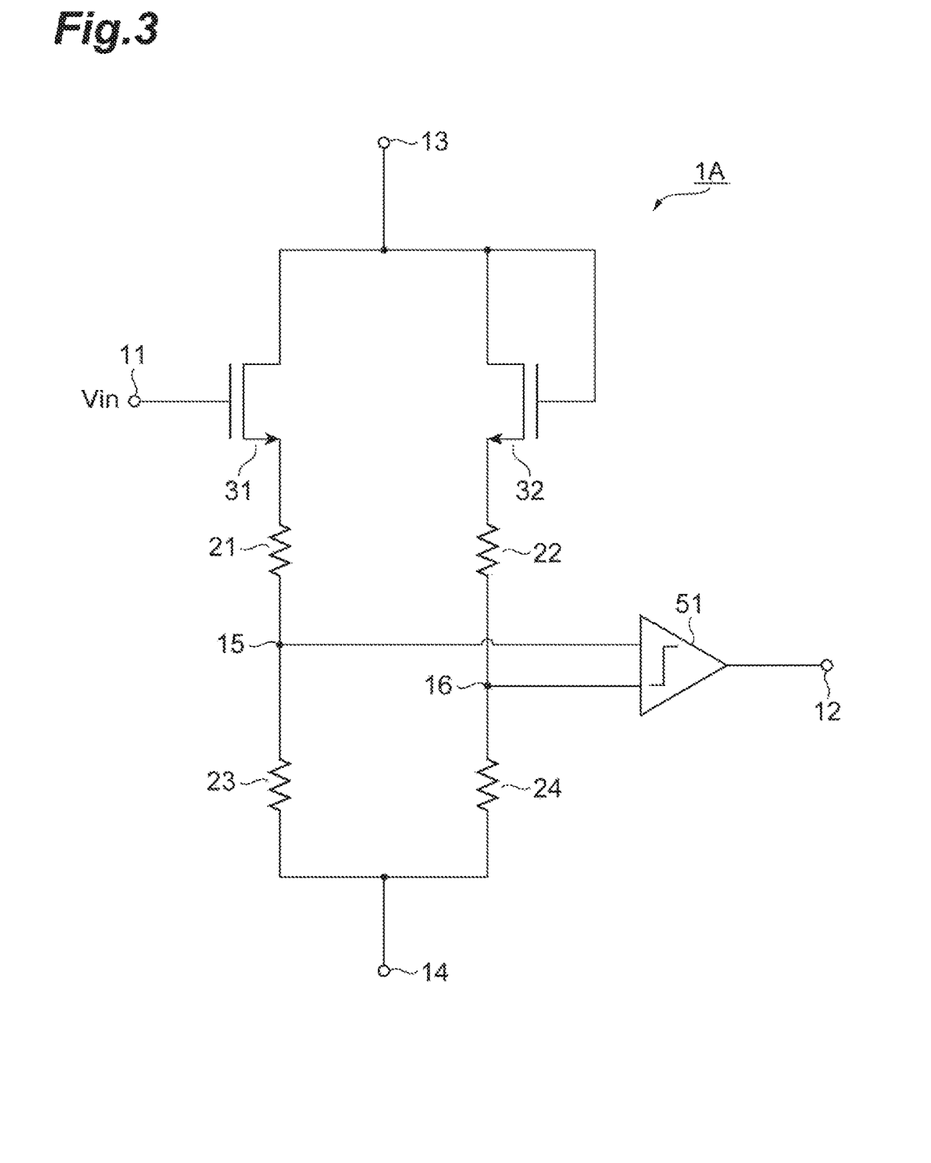
FIG. 3 is a diagram showing a configuration of an input device 1A according to a first embodiment.

FIG. 3 is a diagram showing a configuration of an input device 1A according to a first embodiment. The input device 1A comprises a first MOS transistor 31, a second MOS transistor 32, a first resistor 21, a second resistor 22, a third resistor 23, a fourth resistor 24, and a comparator circuit 51. The input device 1A is driven by a first reference voltage (for example, a power supply voltage VDD) set to a first reference terminal (first reference voltage input terminal) 13 and a second reference voltage (for example, a ground voltage) set to a second reference terminal (second reference voltage input terminal) 14, and outputs, from a signal output terminal 12, a signal having a level corresponding to a state in which a voltage value Vin of an input signal inputted to a signal input terminal 11 is higher or lower than a threshold value $V_{TH\_IN}$.

The first MOS transistor 31 and the second MOS transistor 32 are N-channel MOS transistors, and have the same size and the same characteristics as each other. It is preferable that the first MOS transistor 31 and the second MOS transistor 32 are manufactured on a common semiconductor substrate in the same process with the same design as each other.

The first MOS transistor 31 has a drain connected to the first reference terminal 13 and to which a power supply voltage VDD is applied, a gate connected to the signal input terminal 11 and to which an input signal Vin is inputted, and a source. The second MOS transistor 32 has a drain and a gate connected to the first reference terminal 13 and to which the power supply voltage VDD is applied, and a source.

The first resistor 21 has one end connected to the source of the first MOS transistor 31, and the other end connected to a first node 15. The second resistor 22 has one end connected to the source of the second MOS transistor 32, and the other end connected to a second node 16. The third resistor 23 has one end connected to the first node 15, and the other end connected to the second reference terminal 14. The fourth resistor 24 has one end connected to the second node 16 and the other end connected to the second reference terminal 14.

The comparator circuit 51 has a first input terminal connected to the first node 15, a second input terminal connected to the second node 16, and the signal output terminal 12. The comparator circuit 51 outputs, from the signal output terminal 12, a signal having a level corresponding to a state in which the voltage of the first node 15 is higher or lower than the voltage of the second node 16.

The voltage difference between the gate and the source of each of the first MOS transistor 31 and the second MOS transistor 32 is $V_{GS}$. It is assumed that the resistance value of the first resistor 21 is $R_1$, the resistance value of the second resistor 22 is $R_2$, the resistance value of the third resistor 23 is $R_3$, and the resistance value of the fourth resistor 24 is $R_4$. At this time, the voltage of the first node 15 is expressed by the following formula (4), and the voltage of the second node 16 is expressed by the following formula (5): Therefore, the threshold value $V_{TH\_IN}$ is expressed by the following formulas (6a) and (6b):

$$\frac{R_3}{R_1 + R_3}(Vin + V_{GS}) \quad (4)$$

$$\frac{R_4}{R_2 + R_4}(VDD - V_{GS}) \quad (5)$$

$$V_{TH\_IN} = \alpha \cdot VDD + (1 - \alpha) \cdot V_{GS} \quad (6a)$$

$$\alpha = \frac{R_4/(R_2 + R_4)}{R_3/(R_1 + R_3)} \quad (6b)$$

Since α in the above formula (6b) is expressed by the ratio of each resistance value, the variation is small. By appropriately setting the resistance values $R_1$ to $R_4$, the value of α can be larger than 1. Furthermore, by setting the absolute value of the coefficient (1−α) in the second term on the right side of the above formula (6a) to be less than 1, it is possible to reduce the influence of the variations in $V_{GS}$. For example, α is to be approximately 1.05 to 1.1. In the present embodiment, since the input signal is inputted to the gate of the first MOS transistor 31, the input impedance is high. Therefore, the input device 1A according to the present embodiment can accurately determine whether the voltage value of the input signal is higher or lower than the threshold value when the threshold value is higher than the power supply voltage.

It is preferable that the resistance value $R_3$ of the third resistor 23 and the resistance value $R_4$ of the fourth resistor 24 are equal to each other. It is preferable that the resistance value $R_3$ of the third resistor 23 is more than ten times larger than the resistance value $R_1$ of the first resistor 21, and the resistance value $R_4$ of the fourth resistor 24 is more than 10 times larger than the resistance value $R_2$ of the second resistor 22. In these cases, the difference between the magnitude of the current flowing through the first MOS transistor 31, the first resistor 21 and the third resistor 23, and the magnitude of the current flowing through the second MOS transistor 32, the second resistor 22 and the fourth resistor 24 becomes small. Therefore, the influence due to the characteristic difference between the first MOS transistor 31 and the second MOS transistor 32 is reduced, and it is possible to more accurately determine whether the voltage value of the input signal is higher or lower than the threshold value.

(Second Embodiment)

Figure 4:
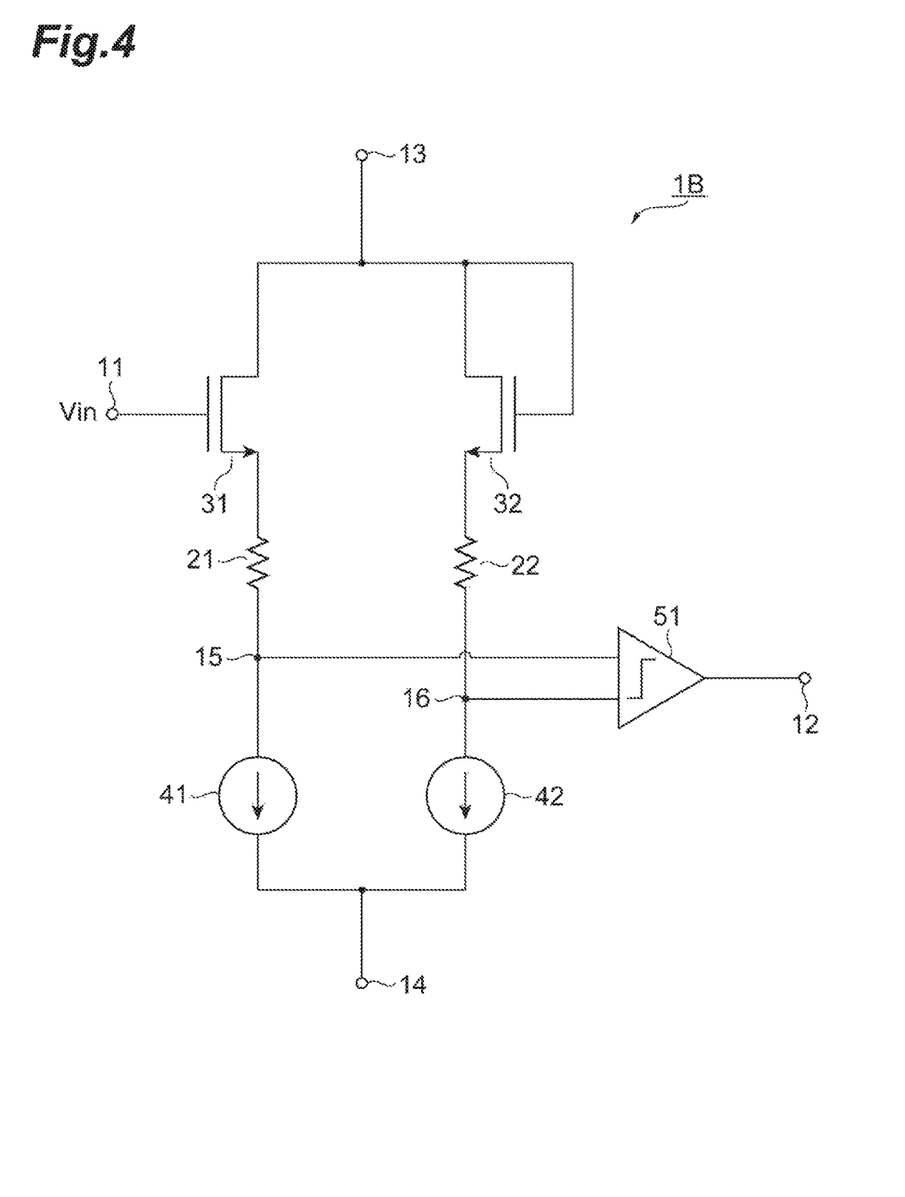
FIG. 4 is a diagram showing a configuration of an input device 1B according to a second embodiment.

FIG. 4 is a diagram showing a configuration of an input device 1B according to a second embodiment. The input device 1B comprises a first MOS transistor 31, a second MOS transistor 32, a first resistor 21, a second resistor 22, a first current source 41, a second current source 42, and a comparator circuit 51. The input device 1B is driven by a first reference voltage (for example, a power supply voltage VDD) set to a first reference terminal 13 and a second reference voltage (for example, a ground voltage) set to a second reference terminal 14, and outputs, from a signal output terminal 12, a signal having a level corresponding to a state in which a voltage value Vin of an input signal inputted to a signal input terminal 11 is higher or lower than a threshold value $V_{TH\_IN}$.

The input device 1B according to the second embodiment shown in FIG. 4 is different from the configuration of the input device 1A according to the first embodiment shown in FIG. 3 in that the first current source 41 and the second current source 42 are provided instead of the third resistor 23 and the fourth resistor 24. The other configuration of the input device 1B according to the second embodiment is the same as that in the first embodiment. The first current source 41 has one end connected to a first node 15 and the other end connected to the second reference terminal 14, and flows a certain amount of current from the first node 15 to the second reference terminal 14. The second current source 42 has one end connected to a second node 16 and the other end connected to the second reference terminal 14, and flows a certain amount of current from the second node 16 to the second reference terminal 14.

The voltage difference between the gate and the source of each of the first MOS transistor 31 and the second MOS transistor 32 is $V_{GS}$. It is assumed that the resistance value of the first resistor 21 is $R_1$ and the resistance value of the second resistor 22 is $R_2$. It is assumed that the current flowed by the first current source 41 is $I_1$ and the current flowed by the second current source 42 is $I_2$. At this time, the voltage of the first node 15 is expressed by Vin-$V_{GS}$-$I_1R_1$, and the voltage of the second node 16 is expressed by VDD-$V_{GS}$-$I_2R_2$. Therefore, the threshold value $V_{TH\_IN}$ is expressed by the following formula (7):

$$V_{TH\_IN} = VDD + I_1R_1 - I_2R_2 \quad (7)$$

In this embodiment, since the input signal is inputted to the gate of the first MOS transistor 31, the input impedance is high. In the present embodiment, by appropriately setting the resistance values $R_1$ and $R_2$, and the currents $I_1$ and $I_2$, it is possible to accurately determine whether the voltage value of the input signal is higher or lower than the threshold value when the threshold value is higher than the power supply voltage. It is preferable that the currents $I_1$ and $I_2$ are equal to each other. The configuration of the present embodiment is effective when the variation in the resistance value is small.

(Third Embodiment)

Figure 5:
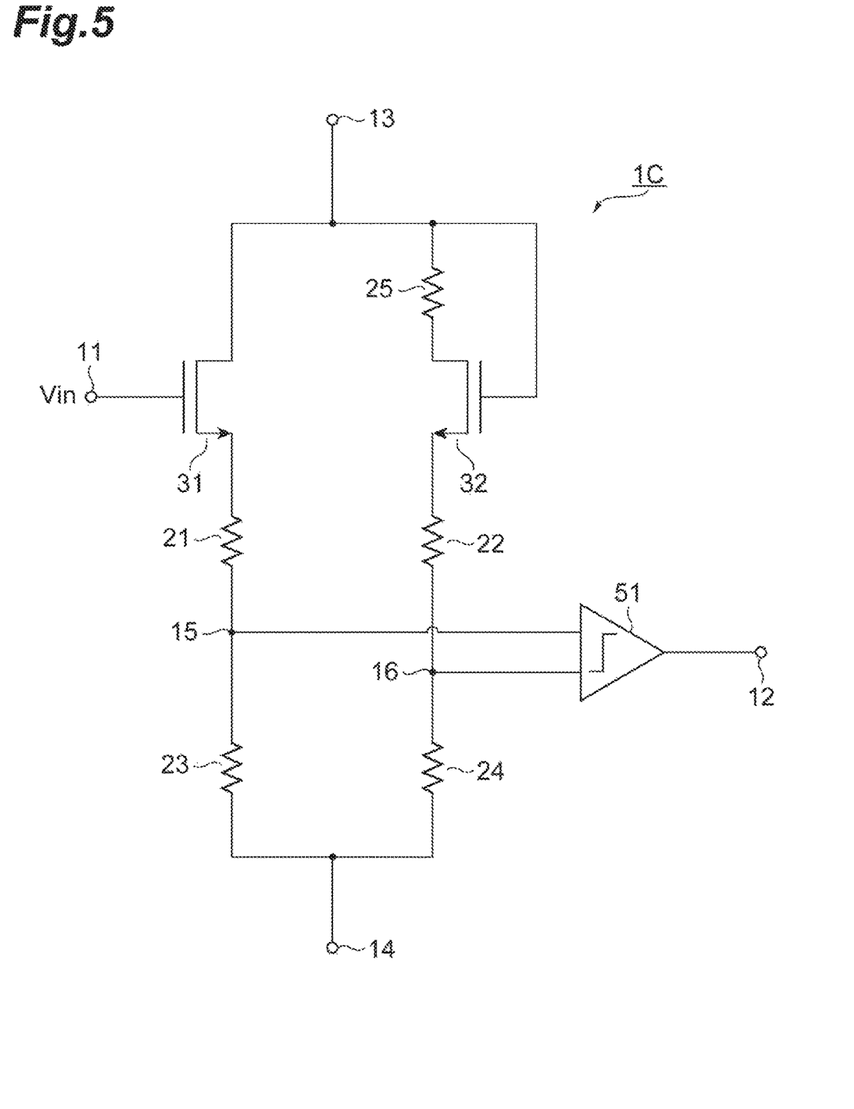
FIG. 5 is a diagram showing a configuration of an input device 1C according to a third embodiment.

FIG. 5 is a diagram showing a configuration of an input device 1C according to a third embodiment. The input device 1C comprises a first MOS transistor 31, a second MOS transistor 32, a first resistor 21, a second resistor 22, a third resistor 23, a fourth resistor 24, a fifth resistor 25, and a comparator circuit 51. The input device 1C is driven by a first reference voltage (for example, a power supply voltage VDD) set to a first reference terminal 13 and a second reference voltage (for example, a ground voltage) set to a second reference terminal 14, and outputs, from a signal output terminal 12, a signal having a level corresponding to a state in which a voltage value Vin of an input signal inputted to a signal input terminal 11 is higher or lower than a threshold value $V_{TH\_IN}$.

The input device 1C according to the third embodiment shown in FIG. 5 is different from the configuration of the input device 1A according to the first embodiment shown in FIG. 3 in that the fifth resistor 25 is further provided. The other configuration of the input device 1C according to the third embodiment is the same as that in the first embodiment. The fifth resistor 25 has one end connected to the first reference terminal 13, and the other end connected to the drain of the second MOS transistor 32. In the present embodiment, it is preferable that the sum of the resistance values of the second resistor 22 and the fifth resistor 25 is equal to the resistance value of the first resistor 21.

The threshold value $V_{TH\_IN}$ in the present embodiment is expressed by the above formulas (6a) and (6b). In the case of the present embodiment, a similar effect to the case of the first embodiment can be obtained. In addition, in the case of the present embodiment, since the fifth resistor 25 is provided, it is possible to reduce the channel length modulation effect of the MOS transistor. That is, the input device 1C in the present embodiment can obtain better characteristics than the case of the first embodiment.

In the configuration of the second embodiment shown in FIG. 4, it is possible to obtain a similar effect to the case of the third embodiment if the fifth resistor 25 is provided between the drain of the second MOS transistor 32 and the first reference terminal 13. That is, in this case (fifth embodiment), the fifth resistor 25 added to the configuration shown in FIG. 4 has one end connected to the first reference terminal 13, and the other end connected to the drain of the second MOS transistor 32.

As described above, according to the present embodiment, it is possible to accurately and easily determine whether the voltage value of the input signal is higher or lower than the threshold value when the threshold value is higher than the power supply voltage.

REFERENCE SIGNS LIST

1A to 1C . . . Input device; 11 . . . Signal input terminal; 12 . . . Signal output terminal; 13 . . . First reference terminal; 14 . . . Second reference terminal; 15 . . . First node; 16 . . . Second node; 21 . . . First resistor; 22 . . . Second resistor; 23 . . . Third resistor; 24 . . . Fourth resistor; 25 . . . Fifth resistor; 31 . . . First MOS transistor; 32 . . . Second MOS transistor; 41 . . . First current source; 42 . . . Second current source; and 51 . . . Comparator circuit.

What is claimed is:

1. An input device comprising:
a first reference terminal set at a first reference voltage;
a second reference terminal set at a second reference voltage;
a single signal input terminal configured to receive an input signal;
a signal output terminal configured to output a signal having a level corresponding to a state in which a voltage value of the input signal is higher or lower than a predetermined threshold value;
a first MOS transistor having a drain directly connected to the first reference terminal, a gate electrically connected to the single signal input terminal, and a source;
a second MOS transistor having a drain electrically connected to the first reference terminal, a gate directly connected to the first reference terminal, and a source;
a first resistor having one end directly connected to the source of the first MOS transistor, and the other end electrically connected to a first node;
a second resistor having one end directly connected to the source of the second MOS transistor, and the other end electrically connected to a second node;
a third resistor having one end electrically connected to the first node, and the other end electrically connected to the second reference terminal;
a fourth resistor having one end electrically connected to the second node, and the other end electrically connected to the second reference terminal; and
a comparator circuit having a first input terminal electrically connected to the first node and set at the same voltage as the first node, a second input terminal electrically connected to the second node and set at the same voltage as the second node, and an output terminal, which is the signal output terminal, configured to output a signal having a level corresponding to a state in which a voltage of the first input terminal is higher or lower than a voltage of the second input terminal.

2. The input device according to claim 1,
wherein a resistance value of the third resistor is equal to a resistance value of the fourth resistor.

3. The input device according to claim 1,
wherein a resistance value of the third resistor is more than ten times larger than a resistance value of the first resistor, and
a resistance value of the fourth resistor is more than 10 times larger than a resistance value of the second resistor.

4. The input device according to claim 2,
wherein the resistance value of the third resistor is more than ten times larger than a resistance value of the first resistor, and
the resistance value of the fourth resistor is more than 10 times larger than a resistance value of the second resistor.

5. The input device according to claim 1, further comprising a fifth resistor having one end directly connected to the first reference terminal, and the other end directly connected to the drain of the second MOS transistor.

6. The input device according to claim 5,
wherein the sum of a resistance value of the second resistor and a resistance value of the fifth resistor is equal to a resistance value of the first resistor.

7. An input device comprising:
a first reference terminal set at a first reference voltage;
a second reference terminal set at a second reference voltage;
a single signal input terminal configured to receive an input signal;
a signal output terminal configured to output a signal having a level corresponding to a state in which a voltage value of the input signal is higher or lower than a predetermined threshold value;
a first MOS transistor having a drain directly connected to the first reference terminal, a gate electrically connected to the single signal input terminal, and a source;
a second MOS transistor having a drain electrically connected to the first reference terminal, a gate directly connected to the first reference terminal, and a source;
a first resistor having one end directly connected to the source of the first MOS transistor, and the other end electrically connected to a first node;
a second resistor having one end directly connected to the source of the second MOS transistor, and the other end electrically connected to a second node;
a first current source having one end electrically connected to the first node, and the other end electrically connected to the second reference terminal;
a second current source having one end electrically connected to the second node, and the other end electrically connected to the second reference terminal; and
a comparator circuit having a first input terminal electrically connected to the first node and set at the same voltage as the first node, a second input terminal electrically connected to the second node and set at the same voltage as the second node, and an output terminal, which is the signal output terminal, configured to output a signal having a level corresponding to a state in which a voltage of the first input terminal is higher or lower than a voltage of the second input terminal.

8. The input device according to claim 7, wherein a current flowing through the first current source is equal to a current flowing through the second current source.

9. The input device according to claim 7, further comprising a fifth resistor having one end directly connected to the first reference terminal, and the other end directly connected to the drain of the second MOS transistor.

10. The input device according to claim 9, wherein the sum of a resistance value of the second resistor and a resistance value of the fifth resistor is equal to a resistance value of the first resistor.

\* \* \* \* \*